United States Patent [19]

Morgan

[11] 4,004,158
[45] Jan. 18, 1977

[54] KEYED COMPARATOR

[75] Inventor: David Keith Morgan, Flemington, N.J.

[73] Assignee: RCA Corporation, New York, N.Y.

[22] Filed: Oct. 6, 1975

[21] Appl. No.: 619,912

[30] Foreign Application Priority Data

Nov. 26, 1974 United Kingdom ............ 51173/74

[52] U.S. Cl. ..................... 307/235 T; 307/297; 330/22; 330/30 D; 330/35; 58/23 A
[51] Int. Cl.² ..................... H03K 5/20; H03K 1/12; H03F 3/04
[58] Field of Search .......... 307/235 R, 235 B, 297, 307/235 T; 58/23 A, 23 BA; 330/22, 30 D, 35

[56] References Cited

UNITED STATES PATENTS

| | | | |
|---|---|---|---|
| 3,278,761 | 10/1966 | Goyer | 307/235 R |
| 3,852,679 | 12/1974 | Schade, Jr. | 330/30 D |
| 3,857,047 | 12/1974 | Knight | 307/235 T |
| 3,863,080 | 1/1975 | Steckler | 307/235 B |
| 3,863,169 | 1/1975 | Knight | 330/22 |
| 3,872,323 | 3/1975 | Frederiksen et al. | 307/235 T |
| 3,876,955 | 4/1975 | Ahmed | 330/22 |

OTHER PUBLICATIONS

"Electrical Amplifier with Input–Bias Network", by Hellwarth IBM Tech. Discl. Bull., pp. 966–967, vol. 14, No. 3, Aug. 1971.

*Primary Examiner*—Stanley D. Miller, Jr.
*Attorney, Agent, or Firm*—H. Christoffersen; S. Cohen; F. R. Perillo

[57] ABSTRACT

In the "on" condition of the circuit, a current mirror supplies a bias current to a comparator, a voltage divider circuit supplies a reference voltage to one input terminal of the comparator, and the input voltage to be compared to the reference voltage is applied to the other input terminal of the comparator. In the "off" condition of the circuit, the current mirror, the comparator and the voltage divider circuit are all cut off to reduce to substantially zero the power consumption of the circuit. The comparator employs regenerative feedback to increase switching speed and gain and minimize the offset voltage. The bias current amplitude is automatically adjusted in response to reference voltage changes, thereby maintaining the bias current level at the value desired for a particular reference voltage.

6 Claims, 1 Drawing Figure

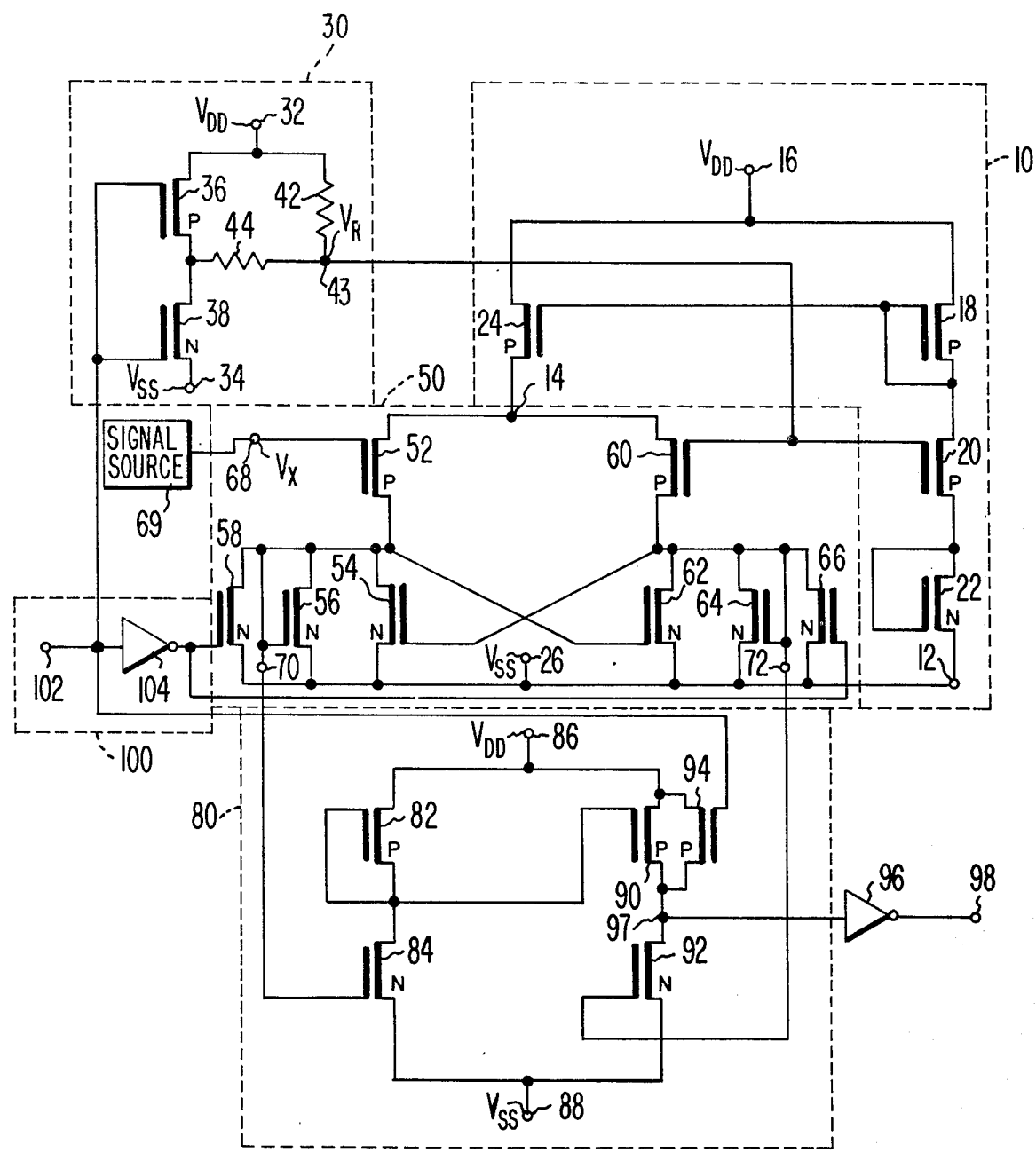

KEYED COMPARATOR

Voltage comparators that may be switched off and that consume minimal power in the off condition have many applications. For example, such a circuit may be part of a system in a light emitting diode (LED) wristwatch for controlling the intensity of the LED display.

The display of an LED wristwatch is normally off in order to reduce power consumption. When it is desired to observe the time, the watch wearer actuates a manual switch and power is applied to appropriate ones of the diodes to cause them to emit light. The power may be in the form of unipolarity pulses having variable pulse width. The duration of these pulses is a measure of both the intensity of the display and the amount of power being employed.

It is desirable in the operation of a wristwatch such as described above that during the time the display is off, the circuits for operating the display employ minimal standby power. The reason is to extend, as long as possible, the life of the small battery providing the power. It is also desirable, for the same reason, that the amount of power employed to operate the display, that is, the duration of the unipolarity pulses, be the minimum necessary to create a pleasing and legible display. However, the amount of power needed to accomplish the latter will depend upon the ambient lighting conditions. A display which looks pleasing at a low level of ambient light, for example that present within a reasonably well lighted room, may look "washed out" in daylight. In order to deal with this problem, circuits have been developed which sense the amount of ambient light and adjust the pulse duration in accordance therewith so that less power is applied to the display when the ambient light intensity is relatively low and more power is applied to the display when the light intensity is relatively high.

An ambient light sensing circuit may include a periodic voltage ramp generating circuit. This ramp generator includes a light sensitive resistance element as part of the time constant circuit that determines ramp slope. During low ambient light levels, this resistance is large and the slope of the voltage ramp is relatively small. As the light intensity increases, the resistance of the light sensitive resistance element decreases, resulting in an increased ramp slope.

The above-described voltage ramp is applied to a voltage comparator biased to switch from a first output voltage to a second condition whenever the input signal voltage exceeds a reference voltage $V_R$. The portion of each ramp period that the comparator is in its second output condition is a function of the ramp slope. The higher the slope, as a result of a relatively high ambient light level, the higher the percentage of each ramp period that the comparator is in its second output condition. The output condition of the comparator may then be used to control the duration of the pulses that power the LED display.

Voltage comprators capable of functioning in the above-described manner are well-known in the art. For example, U.S. application Ser. No. 492,134, now U.S. Pat. No. 3,943,380, filed July 26, 1974 by Morgan and Heuner and assigned to the same assignee as the present application, discloses such a circuit. While the performance of the circuit of the Morgan et al. reference application is adequate for a specific set of operating conditions, it suffers from several potential shortcomings where the circuit is used in more general applications. The voltage comparator is biased at a particular value of current by a current mirror amplifier. If it is desired to vary the input operating conditions of the comparator as, for example, by changing the value of the reference voltage, no provisions exist for automatically adjusting the value of the bias current for optimizing the switching performance with respect to comparator gain and offset voltage.

It is generally desired to obtain the maximum output voltage swing possible from a comparator circuit. This voltage swing generally extends between the supply voltage rail and the reference voltage rail. This rail-to-rail swing is defined herein as a full digital swing. The output of the comparator of the reference application does not have a full digital swing. Additional circuitry is used to increase the range of the voltage swing. Because of the relatively limited output voltage swing of the comparator, this additional circuitry may consume an undesirable amount of power.

In the drawing, the sole FIGURE is a schematic circuit diagram of a preferred embodiment of the invention.

Referring to the drawing, current mirror amplifier 10 includes input node 12; output node 14 and common node 16. Serially connected between nodes 12 and 16 are the conduction paths of PMOS transistors 18 and 20 and NMOS transistor 22. The conduction path of PMOS transistor 24 is connected between nodes 14 and 16. The gate or control electrodes of transistors 24 and 18 are interconnected and this interconnection is connected to the drain electrode of transistor 18. The gate and drain electrodes of transistor 22 are interconnected. Node 16 is connected to a source of positive operating voltage $V_{DD}$ (not shown) while node 12 is connected through terminal 26 to a source of reference potential $V_{SS}$ (not shown) which may be ground potential.

In the circuit description and in the explanation which follows, it should be remembered that an MOS transistor is a bilateral device capable of conducting current in either direction depending upon the polarity of the applied voltages. Thus, a given electrode may be considered a source or a drain terminal. Particular designations are assigned to each electrode herein as a convenience in describing circuit operation.

In voltage reference circuit 30, the conduction paths of PMOS transistor 36 and NMOS transistor 38 are series-connected between nodes 32 and 34. The gate electrodes of these transistors are interconnected. Resistor 42 is connected to node 32 at one end and to resistor 44 at its other end. Resistor 44 is in turn connected to the common connection between transistors 36 and 38. The common node 43 between resistors 42 and 44 is the output node of the reference circuit and is connected to the gate of transistor 20. Nodes 32 and 34 are connected to sources (not shown) of operating and reference potential, respectively. These sources may be the sources connected to nodes 16 and 26, respectively.

In voltage comparator 50, the conduction path of PMOS transistor 52 is connected at one end to node 14. The conduction paths of NMOS transistors 54, 56 and 58 are each connected between the other end of the conduction path of transistor 52 and node 26. The conduction path of PMOS transistor 60 is connected at one end to node 14. The conduction paths of NMOS transistors 62, 64 and 66 are each connected between the other end of the conduction path of transistor 60 and node 26. The gates of transistors 54 and 64 are connected to the interconnection between transistors 60 and 62 while the gates of transistors 62 and 56 are connected to the interconnection between transistors 52 and 54. The gate of transistor 52 is connected to terminal 68 to which a signal $V_X$ from source 69 may be applied. The gate of transistor 60 is connected to the gate of transistor 20 and to output node 43 of voltage reference circuit 30. The gates of transistors 56 and 64 are coupled to a comparator first output node 70 and a comparator second output node 72, respectively.

Differential-to-single-ended converter 80 includes the serially-connected conduction paths of PMOS transistor 82 and NMOS transistor 84 connected between nodes 86 and 88. These nodes are connected to a source of operating and reference potentials, respectively (not shown). These sources may be the sources connected to nodes 16 and 26, respectively. Also connected between nodes 86 and 88 are the serially-connected conduction paths of PMOS transistor 90 and NMOS transistor 92. Connected across the conduction path of transistor 90 is the conduction path of PMOS transistor 94. The gates of transistors 84 and 92 are connected to comparator output nodes 70 and 72, respectively. The gate of transistor 82 is connected to its drain and, in turn, to the gate of transistor 90. Inverter 96 is connected between the interconnection of transistors 90 and 92, node 97, and circuit output terminal 98.

Control circuit 100 is coupled through node 102 to a source of ON/OFF command voltages (not shown). Node 102 is also coupled to the interconnected gates of transistors 36 and 38 and the gate of transistor 94. Inverter 104 is also connected to the node 102. The output of the inverter is connected to the gates of transistors 58 and 66.

In the operation of the circuit, assume initially that a voltage corresponding to an OFF command is applied to node 102. This voltage may be, for example, supply voltage $V_{SS}$. This voltage turns transistor 36 on and transistor 38 off, placing reference voltage node 43 at the supply voltage level $V_{DD}$. This voltage is applied to the gates of transistors 20 and 60, turning these devices off. When transistor 20 is turned off, current mirror amplifier 10 turns off because the mirror input current between nodes 16 and 12 is zero, resulting in zero mirror output current between nodes 16 and 14.

The OFF command is converted to a relatively positive voltage by inverter 104. The inverter output signal turns on transistors 58 and 66. This couples comparator output nodes 70 and 72 to the potential at node 26, $V_{SS}$. With a voltage $V_{SS}$ present at nodes 70 and 72, transistors 84 and 92 are off, ensuring zero current flow through converter 80. The voltage at node 102 is also applied to the gate of transistor 94, rendering it conductive, thereby coupling converter output node 97 to supply voltage node 86. Transistor 94 is not required for the ON/OFF function. Its primary purpose is to ensure that converter output node 97 is held at a known voltage ($V_{DD}$ in this instance) during the off period, rather than being allowed to float. Such a floating node may cause undesired current flow in circuits connected to node 97. It can be seen that during the OFF period, the circuit of the figure has no current flowing through it and power dissipation is essentially zero.

A relatively positive voltage, for example, $V_{DD}$, at node 102 keys the comparator to its ON state. Transistors 38, 20 and 60 are keyed on while transistors 36, 58, 66 and 94 are keyed off, thereby permitting normal circuit operation. In the discussion which follows, the comparator is assumed to be keyed on unless otherwise stated.

When the comparator is enabled, transistor 36 of voltage reference circuit 30 is cut off while transistor 38 is turned on, thereby coupling resistors 42 and 44 between nodes 32 and 34. The reference voltage present at node 43 is a function of the voltage across nodes 32 and 34 as well as the relative values of resistors 42 and 44 and the conduction path impedance of transistor 38. Node 43 is connected to the gates of MOS transistors 60 and 20. Since the impedance at the gate of an MOS transistor is very high and does not load down the voltage divider comprising resistors 42 and 44, the resistance values of these components may be quite large, for example, in the 100 kilohm range. This high resistance minimizes current flow through nodes 32 and 34, thereby causing little power dissipation in the voltage reference circuit.

The impedance of the conduction channel of transistor 38, when it is on, is selected to be very much less than the impedance of resistor 44. As a result, the reference voltage $V_R$ is determined by the relationship $$V_R = V_Y \left( \frac{R_{44}}{R_{44} + R_{42}} \right) + V_{SS}$$

where $V_Y$ is the voltage across nodes 32 and 34, and $R_{44}$ and $R_{42}$ are the resistance values of resistors 44 and 42, respectively.

The reference voltage $V_R$ is applied to the gate of transistor 20. Transistor 20 in combination with transistor 18 is a source follower amplifier, with transistor 18 serving as the load impedance for transistor 20. The voltage drop across, as well as the current through, transistor 18 will be controlled by the voltage present at the gate of transistor 20. For a given voltage $V_R$, transistor 18 will have a particular conduction path impedance. This impedance, and to a lesser extent the conduction path impedances of transistors 20 and 22, as well as the voltage $V_R$, determines the input current of mirror 10.

Transistor 22 has a voltage drop across it equal to its threshold voltage. This voltage drop reduces the supply voltage available for transistor 20, thereby reducing the drain-to-source voltage drop across this device. As a result, the conduction path impedance of transistor 20 is restricted to a relatively low value compared to transistor 18.

The output path of mirror 10 comprises the conduction path of transistor 24. Current flow through this device is proportional to that flowing through transistor 18. The relative value of the output current and the input current depends on the relative dimensions of transistors 24 and 18. In the present example, the input and output currents are equal although other input-output current ratios may be selected.

The output current of mirror 10 is applied as a bias current to node 14 of comparator 50. This current divides between transistors 52 and 60 as a function of the conduction states of the comparator transistors.

The gate of transistor 60 receives the reference voltage $V_R$ while the gate of transistor 52 receives the voltage $V_X$ from source 69. The relative values of these two voltages $V_R$ and $V_X$ determine the conduction states of the comparator transistors.

In the operation of comparator 50, transistors 56 and 64 are connected as load impedances to transistors 52 and 60, respectively. Transistor 56 in combination with transistor 62 comprises a first current mirror amplifier while transistor 64 in combination with transistor 54 comprises a second current mirror amplifier. The effect of each current mirror amplifier is to provide regenerative action in the comparator during switching intervals, thereby increasing the switching speed and the differential output voltage of the comparator.

Assume now that an input voltage $V_X$ is applied to node 68 and this voltage has a value less than the value of reference voltage $V_R$. This voltage may be, for example, the prior-mentioned voltage ramp used in the ambient light sensing circuit. However, it should be apparent that comparator operation is not restricted to the use of an input voltage having this particular waveshape. For this condition, transistor 52 is conducting more heavily than transistor 60. Transistors 52 and 60 are of equal size, therefore, most of the comparator bias current flowing into node 14 from current mirror amplifier 10 will be flowing through transistor 52. The heavy conduction of transistor 52 causes the gate voltage of transistor 56 to be relatively positive with respect to the gate voltage of transistor 64. As a result, comparator output node 70 is more positive than the voltage at node 72. The positive voltage at the gate of transistor 56 tends to increase current through this device. This decreases the conduction path impedance of the mirror transistor 62 associated with transistor 56. Transistor 62 is connected in the opposite leg of the comparator circuit. As this device conducts more heavily, the voltage at node 72 is further decreased because it is pulled towards the voltage $V_{SS}$ at node 26 through transistor 62. Thus, the cross-coupling or positive feedback between the comparator paths tends to increase the potential difference between comparator nodes.

When the value of voltage $V_X$ becomes equal to the value of $V_R$, the bias current will be essentially equally divided between transistors 52 and 60. The voltage difference between nodes 70 and 72 approaches zero. The actual voltage difference between these two points is a function of the degree of matching between transistors 52 and 60, 56 and 62, and 54 and 64.

When the voltage $V_X$ is greater than $V_R$, transistor 60 will conduct more heavily than transistor 52 and most of the bias current flows through the former device. The voltage at node 72 is more positive than the voltage at node 70. As was the case when $V_X$ was less than $V_R$, cross-coupling between comparator paths tends to increase this difference. In this instance, the voltage at node 72 decreases the conduction path impedance of the mirror transistor 54 associated with transistor 64. As a result, the voltage at node 70 is further decreased as it approaches the value of the voltage at node 26.

In summary, when $V_X$ is less than $V_R$, the voltage at node 70 is more positive than the voltage at node 72. Positive feedback between comparator paths tends to increase this voltage difference by further decreasing the voltage at node 72. When $V_X$ is greater than $V_R$, the voltage at node 72 is more positive than the voltage at node 70 and the positive feedback tends to increase this voltage difference by further decreasing the voltage at node 70.

When $V_X$ approaches $V_R$, the value of the voltages at nodes 70 and 72 approach each other. However, because of the cross-coupling, the voltages at these nodes will be equal for only a very narrow range of input voltage values. This is because any slight voltage imbalance between the two nodes tends to be accentuated by the cross-coupling of the comparator paths. As a result, the switching of comparator states tends to be much more rapid than the switching of more conventional comparator circuits that do not employ cross-coupling.

The cross-coupling employed within comparator 50 thus results in several advantages. The voltage difference between its output nodes is increased thus making it easier to obtain an output voltage range approaching a full digital swing when the comparator output nodes are coupled to output circuitry such as that to be described below. This represents an increase in the gain of this comparator. A second advantage of the cross-coupling is the increased switching speed of the comparator circuit. An additional advantage of the cross-coupling is a decrease in offset voltage between $V_X$ and $V_R$ at the point of switching.

The comparator output voltage is coupled to differential-to-single-ended converter 80. Converter 80 transforms the difference signal developed across nodes 70 and 72 to a single-ended output voltage present at node 97. In the present example, converter transistors 84 and 92 and comparator transistors 56 and 64 have equal dimensions. Transistors 56 and 84 form a current mirror amplifier while transistors 64 and 92 form an additional mirror. Also, transistors 82 and 90 form a third current mirror amplifier. Current flowing into comparator node 70 is mirrored by transistor 84 to a converter current flowing through transistor 82 and 84. This current is in turn mirrored by transistor 90 to a current flowing into converter output node 97. At the same time, current flowing into comparator node 72 is mirrored by transistor 92 to an additional current flowing at node 97. When the current through comparator transistor 52 is greater than the current through transistor 60, the current through converter transistor 84 is greater than the current through transistor 92. This causes transistors 82 and 90 to conduct heavily. The heavy conduction of transistor 90 tends to cause the voltage at node 97 to approach the voltage present at node 86 ($V_{DD}$).

When the current through comparator transistor 60 is greater than the current through transistor 52, comparator transistor 92 conducts more heavily than transistors 84, 82 and 90. The heavy conduction of transistor 92 tends to cause the voltage at node 97 to approach the voltage present at node 88 ($V_{SS}$). Because of the cross-coupling within the comparator circuit, transistor 90 of converter 80 tends to be fully on while transistor 92 is fully off and vice versa. As a result, no steady state power is consumed in the output path of the converter. While inverter 96 is not essential to the operation of comparator 80, its use is suggested. The speed at which the voltage at node 97 may switch is a function, in part, of the capacitance present at this point. It is desirable to minimize the effects of load elements connected to output terminal 98 by isolating node 97 with an interface circuit such as inverter 96.

An additional feature of the circuit of the figure will now be considered. In the prior discussion, it was stated that the output current of mirror 10 is a function of the voltage drop across transistor 18. This voltage across transistor 18 is controlled by the voltage $V_R$ present at the gate of transistor 20. The comparator bias current must be chosen with respect to two principal constraints. If the bias current is too small, the comparator gain and bandwidth may be reduced, thereby slowing the comparator switching speed. If the bias current is too large for a given reference voltage, all of the bias current is not able to flow through transistor 60 for the condition where $V_X$ is greater than $V_R$.

The excess current flows through the path including transistor 52. The effect of this excess current is to cause a possible error in the switching point of the comparator. It is desirable to have the comparator output voltage change its state for the smallest possible difference between voltages $V_X$ and $V_R$. For a properly biased comparator circuit, this difference, or offset voltage, may be on the order of 0.050 volts. If the bias current is excessive, this voltage difference increases. Such a condition is undesirable for most comparator operations. In addition, the excessive bias current may introduce a hysteresis error into the comparator switching response.

In the previous circuit of the Morgan et al. application, the comparator is biased at a current level that is suitable for the particular reference voltage $V_R$. If it is desired to alter the reference voltage, thereby changing the input voltage $V_X$ needed to cause a change of state of the comparator, the bias current may no longer be suitable for the reasons outlined above. In the circuit of the present invention, the bias current automatically is compensated when the voltage $V_R$ is altered.

If voltage $V_R$ is increased, for example, by altering the voltage divider ratio between resistors 42 and 44, transistor 60 is biased closer to cutoff and is therefore able to conduct less current. In this case, it is desirable to reduce the output current of current mirror amplifier 10. In a circuit such as that of the Morgan et al. application, it is necessary to rebias the source of bias current, which may be inconvenient when the circuit is realized in integrated circuit form. In the present invention, an increase in voltage $V_R$ decreases the voltage drop across transistor 18. This in turn reduces the gate voltage of transistor 24 and hence the output current of current mirror amplifier 10, thereby achieving the desired reduction in bias current.

In a similar vein, when $V_R$ is decreased, it is desirable to increase the bias current because transistor 60 is able to conduct this added current. The decreased voltage $V_R$ increases the voltage drop across transistor 18, thereby increasing the gate voltage of transistor 24 and hence the current mirror amplifier output by the desired amount. As a result, comparator 50 remains biased at the proper level.

A keyed voltage comparator circuit has been described having relatively fast switching speed and a rail-to-rail digital output voltage swing. In addition, the circuit consumes little or no power when it is keyed to its off state. Finally, the circuit automatically compensates for changes in reference voltage, thereby maintaining the bias current of the comparator circuit at the desired level.

What is claimed is:
1. The combination of:
a comparator comprising first and second conduction paths connected in parallel between first and second terminals, two control electrodes, one coupled to each path, for controlling the impedance of the respective conduction paths, means for applying a reference signal to one electrode, means for applying the signal to be compared with the reference signal to the other electrode, output means in at least one of the paths, and a current source connected between said first and second terminals; and
means responsive to the amplitude of said reference signal for controlling the amount of current supplied by said current source to said comparator.

2. The combination of claim 1 further including a current mirror amplifier having an input current path, an output current path connected at one end to one end of said input current path at a common node, said current source comprising said output current path, said output current path supplying the current which flows through the first and second conduction paths of said comparator, and wherein said means responsive to the amplitude of said reference signal comprises means for controlling the conduction through the input current path of said current mirror amplifier to thereby control the current supplied by said output current path to said comparator.

3. The combination of claim 2 wherein said input current path comprises a first transistor having a conduction path, and a control electrode receptive of said reference signal for controlling the conduction through said path, said conduction path comprising said input current path of said current mirror amplifier; and
a second transistor having a conduction path and a control electrode, said second transistor conduction path connected at one end to said current mirror amplifier common node, and at its other end to one end of said first transistor conduction path and said second transistor control electrode connected to said other end of said second transistor conduction path, whereby when said reference signal is changed, the current through said input current path of said current mirror amplifier changes and the current through said output current path of said current mirror amplifier changes proportionally.

4. The combination as set forth in claim 1 wherein said current source comprises, in combination:
an input, output and common nodes;
first, second and third MOS transistors each having a control electrode and a conduction path, said third transistor being of opposite polarity to said first and second transistors, the conduction paths of said transistors serially-connected between said common and said input nodes, said first and third transistors being diode connected, and said second transistor control electrode connected to said means for applying a reference signal; and
a fourth MOS transistor having a fourth control electrode and a fourth conduction path, said fourth conduction path connected between said common and said output nodes and said fourth control electrode connected to said first transistor control electrode.

5. The combination as set forth in claim 1 wherein said first conduction path comprises a first control signal responsive variable impedance connected between said first terminal and a first reference node and first impedance means connected between said first reference node and said second terminal and said second conduction path comprises a second control signal responsive variable impedance connected between said first terminal and a second reference node and second impedance means connected between said second reference node and said second terminal.

6. The combination as set forth in claim 5 further including means responsive to a signal level at said first reference node for varying the impedance between said second reference node and said second terminal and means responsive to a signal level at said second reference node for varying the impedance between said first reference node and said second terminal.

* * * * *

Disclaimer

4,004,158.—*David Keith Morgan*, Flemington, N.J. KEYED COMPARATOR. Patent dated Jan. 18, 1977. Disclaimer filed Aug. 11, 1977, by the assignee, *RCA Corporation*.

Hereby enters this disclaimer to claims 1 and 2 of said patent.

[*Official Gazette October 18, 1977.*]